United States Patent
Chen et al.

(10) Patent No.: US 8,008,992 B2
(45) Date of Patent: Aug. 30, 2011

(54) TRANSFORMER WITH SYMMETRIC STRUCTURE

(75) Inventors: Chi-Han Chen, Kaohsiung County (TW); Pao-Nan Lee, Pingtung County (TW); Ying-Chieh Shyu, Changhua County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 224 days.

(21) Appl. No.: 12/366,892

(22) Filed: Feb. 6, 2009

(65) Prior Publication Data

US 2010/0007439 A1  Jan. 14, 2010

(30) Foreign Application Priority Data

Jul. 11, 2008 (TW) ................................ 97126432 A

(51) Int. Cl.
  *H03H 7/00* (2006.01)
(52) U.S. Cl. ........................................ 333/177; 333/167
(58) Field of Classification Search ..................... 333/25, 333/26, 177, 119, 167, 175, 176, 204; 336/200, 336/232
See application file for complete search history.

(56) References Cited

U.S. PATENT DOCUMENTS

| | | | | |
|---|---|---|---|---|
| 3,903,487 | A * | 9/1975 | Maier | 333/177 |
| 4,894,629 | A * | 1/1990 | Okamura et al. | 333/177 |
| 5,285,179 | A * | 2/1994 | Wignot et al. | 334/15 |
| 5,477,204 | A * | 12/1995 | Li | 336/200 |
| 5,886,589 | A * | 3/1999 | Mourant | 333/26 |
| 6,125,269 | A * | 9/2000 | Brekelmans | 455/180.1 |
| 6,501,363 | B1 * | 12/2002 | Hwu et al. | 336/200 |
| 6,954,116 | B2 * | 10/2005 | Nosaka | 333/26 |
| 7,511,596 | B2 * | 3/2009 | Chung et al. | 333/175 |
| 2005/0068126 | A1 * | 3/2005 | Muto | 333/204 |

* cited by examiner

*Primary Examiner* — Robert Pascal
*Assistant Examiner* — Kimberly E Glenn
(74) *Attorney, Agent, or Firm* — J.C. Patents

(57) ABSTRACT

A transformer is provided with four capacitors and four inductors. The first capacitor is electrically connected between a first port and ground in series. The first inductor is electrically connected to the first port in series. The second capacitor is electrically connected between the first inductor and ground in series. The second inductor is electrically connected between the first inductor and the second capacitor in series. The third capacitor is electrically connected between a second port and ground in series. The third inductor is electrically connected to the second port in series. The fourth capacitor is electrically connected between a third port and ground in series. The fourth inductor is electrically connected between the third inductor and the third port in series.

9 Claims, 2 Drawing Sheets

TRANSFORMER WITH SYMMETRIC STRUCTURE

CROSS-REFERENCE TO RELATED APPLICATION

This application claims the priority benefit of Taiwan application serial no. 97126432, filed on Jul. 11, 2008. The entirety of the above-mentioned patent application is hereby incorporated by reference herein and made a part of specification.

BACKGROUND OF THE INVENTION

1. Field of the Invention

The present invention generally relates to a transformer.

2. Description of Related Art

In a balanced-unbalanced band pass filter, an interactive magnetic coupling between two inductors constituting the transformer is used to generate a mutual induction, so as to deliver a differential signal on a single end. Under the miniaturization trend of electronic products, electronic components are integrated in a circuit substrate, for example, capacitors, inductors, resistors, and other passive components. In the transformer, two inductors formed by a coil may be achieved through a circuit layout of the circuit substrate.

FIG. 1 shows a conventional transformer. Referring to FIG. 1, the conventional typical transformer includes a first inductor L1 and a second inductor L2. Through an interactive electromagnetic induction between the first inductor L1 and the second inductor L2, an input voltage between two ends of the first inductor L1 is converted into an output voltage between two ends of the second inductor L2. Theoretically, a ratio of the input voltage to the output voltage is equal to a ratio of the first inductor L1 value to the second inductor L2.

FIG. 2 shows another conventional transformer. Referring to FIG. 2, different from the typical transformer of FIG. 1, the transformer of FIG. 2 may convert a single signal into a differential signal pair. The transformer of FIG. 2 includes a first capacitor C11, a first inductor L11, a second capacitor C12, a second inductor L12, a third capacitor C13, and a third inductor L13. A first mutual inductor Lm11 is generated by an interaction between the first inductor L11 and the second inductor L12, and a second mutual inductor Lm12 is generated by an interaction between the first inductor L11 and the third inductor L13. Through the first mutual inductor Lm11 and the second mutual inductor Lm12, a signal input to a first port P11 is converted into a differential signal pair, and then output through a second port P12 and a third port P13.

SUMMARY OF THE INVENTION

Accordingly, the present invention is directed to a transformer, for simplifying a layout design.

The present invention is directed to a transformer, applicable for a band pass filter, for generating a transmission zero to increase a stop band attenuation rate of the band pass filter.

A transformer is provided in the present invention, which includes four capacitors, four inductors, and a first additional capacitor. The first capacitor is electrically connected between a first port and ground in series. The first inductor is electrically connected to the first port in series. The second capacitor is electrically connected between the first inductor and ground in series. The second inductor is electrically connected between the first inductor and the second capacitor in series. The third capacitor is electrically connected between a second port and ground in series. The third inductor is electrically connected to the first port in series. The fourth capacitor is electrically connected between a third port and ground in series. The fourth inductor is electrically connected between the third inductor and the third port in series. The first additional capacitor satisfies a preset capacitance value. A first mutual inductor having a predetermined inductance value is generated by an interaction between the first inductor and the third inductor, and is electrically connected to the first additional capacitor in parallel.

In an embodiment of the present invention, the first additional capacitor is a parasitic capacitor and is generated by the interaction between the first inductor and the third inductor.

In an embodiment of the present invention, the transformer further includes a second additional capacitor. A second mutual inductor having a predetermined inductance value is generated by an interaction between the second inductor and the fourth inductor, and the second mutual inductor is electrically connected to the second additional capacitor in parallel.

In an embodiment of the present invention, inductance values of the first inductor, the second inductor, the third inductor, and the fourth inductor are substantially the same.

In an embodiment of the present invention, the second additional capacitor is a parasitic capacitor and is generated by the interaction between the second inductor and the fourth inductor.

In an embodiment of the present invention, the first inductor and the third inductor are symmetric to each other, and the second inductor and the fourth inductor are symmetric to each other.

In an embodiment of the present invention, the first capacitor and the third capacitor are symmetric to each other, and the second capacitor and the fourth capacitor are symmetric to each other.

In an embodiment of the present invention, the first inductor and the second inductor are formed by the same coil.

In an embodiment of the present invention, the third inductor and the fourth inductor are formed by the same coil.

When the transformer of the present invention is applied to a band pass filter, the transmission zero is generated by the parasitic capacitor and the mutual inductor generated by the interaction between the two inductors, thereby increasing the stop band attenuation rate of the band pass filter. In addition, the transformer of the present invention is changed from a conventional asymmetric structure into a symmetric structure, which is helpful for simplifying the layout design of the transformer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
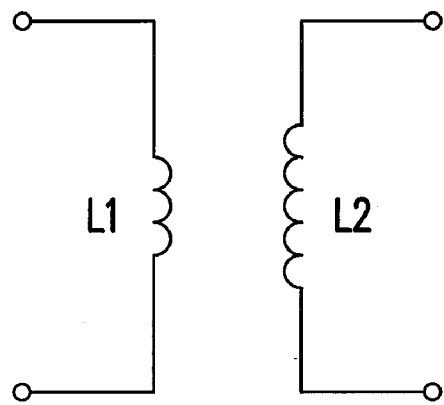
FIG. 1 shows a conventional transformer.
Figure 2:
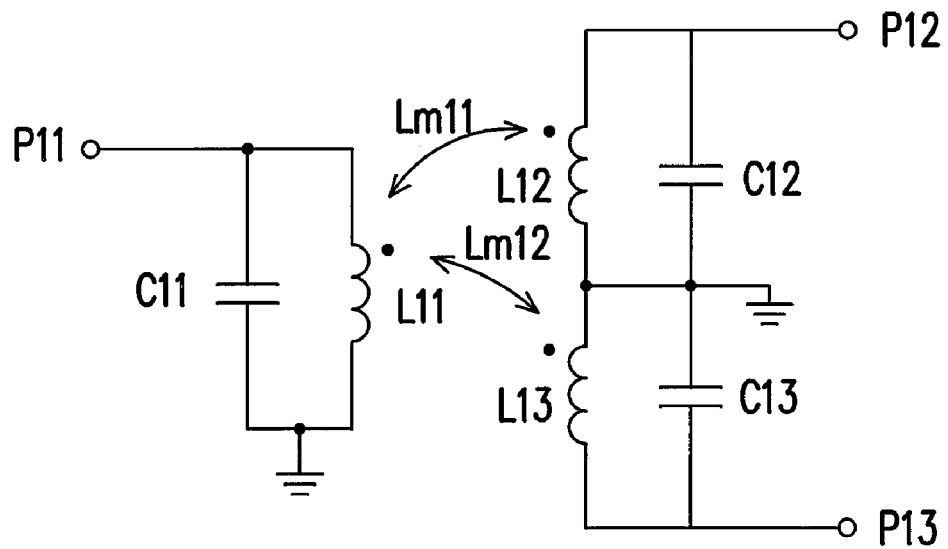
FIG. 2 shows another conventional transformer.

Reference will now be made in detail to the present embodiments of the invention, examples of which are illustrated in the accompanying drawings. Wherever possible, the same reference numbers are used in the drawings and the description to refer to the same or like parts.

Figure 3:
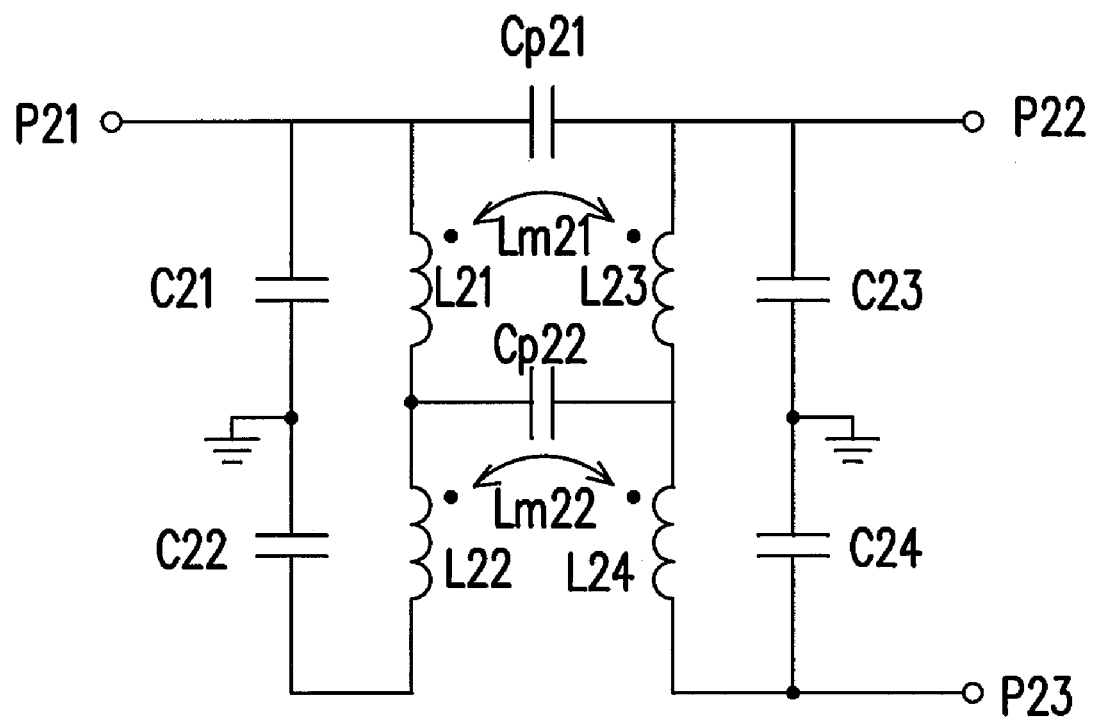
FIG. 3 shows a transformer according to an embodiment of the present invention.

FIG. 3 shows a transformer according to an embodiment of the present invention. Referring to FIG. 3, a transformer of this embodiment includes four capacitors C21-C24 and four inductors L21-L24. A first capacitor C21 is electrically connected between a first port P21 and ground in series. A first inductor L21 is electrically connected to the first port P21 in series. A second capacitor C22 is electrically connected between the first inductor L21 and ground in series. A second inductor L22 is electrically connected between the first inductor L21 and the second capacitor C22 in series. A third capacitor C23 is electrically connected between a second port P22 and ground in series. A third inductor L23 is electrically connected to the second port P22 in series. A fourth capacitor C24 is electrically connected between a third port P23 and ground in series. A fourth inductor L24 is electrically connected between the third inductor L23 and the third port P23 in series.

In addition, the transformer further includes a first additional capacitor Cp21. A first mutual inductor Lm21 is generated by an interaction between the first inductor L21 and the third inductor L23, and the first additional capacitor Cp21 is electrically connected to the first mutual inductor Lm21 in parallel, such that a high-frequency transmission zero characteristic is generated, thereby enhancing a capability of inhibiting the high-frequency noise interference.

A capacitance value of the first additional capacitor Cp21 and an inductance value of the first mutual inductor Lm21 are both preset values. The process of generating the first additional capacitor Cp21 and the first mutual inductor Lm21 and controlling the capacitance value and the inductance value thereof is to adjust the inductance values of the first inductor L21 and the third inductor L23 and distance between the first inductor L21 and the third inductor L23.

In this embodiment, the first additional capacitor Cp21 may be a parasitic capacitor and is generated by the interaction between the first inductor L21 and the third inductor L23.

In this embodiment, a second additional capacitor Cp22 and a second mutual inductor Lm22 are generated by an interaction between the second inductor L22 and the fourth inductor L24, in which the second additional capacitor Cp22 is electrically connected to the second mutual inductor Lm22 in parallel, such that the high-frequency transmission zero characteristic is generated, thereby enhancing the capability of inhibiting the high-frequency noise interference.

A capacitance value of the second additional capacitor Cp22 and an inductance value of the second mutual inductor Lm22 are both preset values. The process of generating the second additional capacitor Cp22 and the second mutual inductor Lm22 and controlling the capacitance value and the inductance value thereof is to adjust the inductance values of the second inductor L22 and the fourth inductor L24 and the positions between the second inductor L22 and the fourth inductor L24.

In this embodiment, the second additional capacitor Cp22 may be a parasitic capacitor and is generated by the interaction between the second inductor L22 and the fourth inductor L24. In this embodiment, the inductance values of the first inductor L21, the second inductor L22, the third inductor L23, and the fourth inductor L24 are substantially the same.

In this embodiment, the first inductor L21 and the third inductor L23 may be symmetric to each other, and the second inductor L22 and the fourth inductor L24 may be symmetric to each other. In addition, the first capacitor C21 and the third capacitor C23 may be symmetric to each other, and the second capacitor C22 and the fourth capacitor C24 may be symmetric to each other. Furthermore, the first inductor L21 and the second inductor L22 may be formed by the same coil, and the third inductor L23 and the fourth inductor L24 may be formed by the same coil. The first inductor L21 and the second inductor L22, the third inductor L23 and the fourth inductor L24 are only the names for the convenience of differentiation. In terms of the actual circuit layout, the first inductor L21 and the second inductor L22 are respectively two parts of one inductor coil, and the third inductor L23 and the fourth inductor L24 are respectively two parts of another inductor coil. Therefore, the layout design of the transformer is simplified.

To sum up, when the transformer of the present invention is applied to a band pass filter, the parasitic capacitor and the mutual inductor generated by the interaction between the two inductors are used for achieving a transmission zero, thereby enhancing the stop band attenuation rate of the band pass filter. In addition, the transformer of the present invention is changed from a conventional asymmetric structure into a symmetric structure, which is helpful for simplifying the layout design of the transformer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transformer, comprising:
   a first capacitor, electrically connected between a first port and a ground in series;
   a first inductor, electrically connected to the first port in series;
   a second capacitor, electrically connected between the first inductor and the ground in series;
   a second inductor, electrically connected between the first inductor and the second capacitor in series;
   a third capacitor, electrically connected between a second port and the ground in series;
   a third inductor, electrically connected to the second port in series;
   a fourth capacitor, electrically connected between a third port and the ground in series;
   a fourth inductor, electrically connected between the third inductor and the third port in series; and
   a first additional capacitor, having a predetermined capacitance value,
   wherein a first mutual inductor having a predetermined inductance value is generated by an interaction between the first inductor and the third inductor, and the first mutual inductor is electrically connected to the first additional capacitor in parallel.

2. The transformer according to claim 1, wherein the first additional capacitor is a parasitic capacitor and is generated by the interaction between the first inductor and the third inductor.

3. The transformer according to claim 1, further comprising:
   a second additional capacitor, having a predetermined capacitance value,
   wherein a second mutual inductor having a predetermined inductance value is generated by an interaction between the second inductor and the fourth inductor, and the second mutual inductor is electrically connected to the second additional capacitor in parallel.

4. The transformer according to claim 3, wherein the second additional capacitor is a parasitic capacitor and is generated by the interaction between the second inductor and the fourth inductor.

5. The transformer according to claim 3, wherein inductance values of the first inductor, the second inductor, the third inductor, and the fourth inductor are substantially the same.

6. The transformer according to claim 1, wherein the first inductor and the third inductor are symmetric to each other, and the second inductor and the fourth inductor are symmetric to each other.

7. The transformer according to claim 1, wherein the first capacitor and the third capacitor are symmetric to each other, and the second capacitor and the fourth capacitor are symmetric to each other.

8. The transformer according to claim 1, wherein the first inductor and the second inductor are formed by a same coil.

9. The transformer according to claim 1, wherein the third inductor and the fourth inductor are formed by a same coil.

* * * * *